United States Patent
Maki et al.

(10) Patent No.: US 10,879,005 B2
(45) Date of Patent: Dec. 29, 2020

(54) ELECTRONIC COMPONENT AND METHOD OF MANUFACTURING SAME

(71) Applicant: Murata Manufacturing Co., Ltd., Kyoto (JP)

(72) Inventors: Yoshifumi Maki, Nagaokakyo (JP); Hirotsugu Tomioka, Nagaokakyo (JP); Shinichiro Izumi, Nagaokakyo (JP); Eiji Iso, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 701 days.

(21) Appl. No.: 15/613,498

(22) Filed: Jun. 5, 2017

(65) Prior Publication Data

US 2017/0271081 A1  Sep. 21, 2017

Related U.S. Application Data

(63) Continuation of application No. PCT/JP2015/084060, filed on Dec. 3, 2015.

(30) Foreign Application Priority Data

Dec. 10, 2014  (JP) .................................. 2014-249622

(51) Int. Cl.
*H01G 4/248* (2006.01)
*H01G 4/30* (2006.01)
(Continued)

(52) U.S. Cl.
CPC ......... *H01G 4/248* (2013.01); *H01F 17/0013* (2013.01); *H01F 27/02* (2013.01);
(Continued)

(58) Field of Classification Search
CPC ...... H01F 17/00–08; H01F 27/00–427; H01G 4/00–40; H01G 4/252
See application file for complete search history.

(56) References Cited

U.S. PATENT DOCUMENTS

| 2006/0014303 A1* | 1/2006 | Takazawa | H01F 17/0013 438/1 |
| 2013/0020913 A1* | 1/2013 | Shirakawa | H01G 4/30 310/364 |
| 2014/0049353 A1* | 2/2014 | Yoon | H01F 27/28 336/227 |

FOREIGN PATENT DOCUMENTS

| CN | 203377068 U | 1/2014 |
| JP | S63-115206 U | 7/1988 |

(Continued)

OTHER PUBLICATIONS

An Office Action mailed by the Korean Patent Office dated Jun. 1, 2018, which corresponds to Korean Patent Application 10-2017-7015349 and is related to U.S. Appl. No. 15/613,498.

(Continued)

*Primary Examiner* — Jared Fureman
*Assistant Examiner* — Christopher J Clark
(74) *Attorney, Agent, or Firm* — Studebaker & Brackett PC

(57) ABSTRACT

In electronic devices, as a result of miniaturization, the distance between a mounting board and an upper board or a shield case and the like, or the distance between the mounting board and other electronic components mounted adjacent thereto has become smaller. An electronic component is provided with: an element body internally containing a circuit element; and a terminal formed on the element body. The terminal is formed over an end surface of the element body and a surface adjacent to the end surface. An insulating film covering the terminal is formed on the element body. The terminal is exposed from the insulating film at least at a mounting surface of the element body, and a plating film containing tin is formed on a portion of the terminal exposed from the insulating film.

15 Claims, 9 Drawing Sheets

(51) Int. Cl.
*H01G 4/252* (2006.01)
*H01F 27/29* (2006.01)
*H01G 4/232* (2006.01)
*H01F 17/00* (2006.01)
*H01F 27/36* (2006.01)
*H01F 27/02* (2006.01)
*H01F 27/28* (2006.01)
*H01G 4/40* (2006.01)
*H03H 1/00* (2006.01)
*H01G 4/12* (2006.01)

(52) U.S. Cl.
CPC ......... *H01F 27/2823* (2013.01); *H01F 27/29* (2013.01); *H01F 27/36* (2013.01); *H01G 4/232* (2013.01); *H01G 4/252* (2013.01); *H01G 4/30* (2013.01); *H01G 4/40* (2013.01); *H03H 1/00* (2013.01); *H01G 4/12* (2013.01); *H03H 2001/0057* (2013.01)

(56) References Cited

FOREIGN PATENT DOCUMENTS

| JP | H06-084687 A | 3/1994 |
| JP | H08-124761 A | 5/1996 |
| JP | H09-134839 A | 5/1997 |
| JP | 2002-359103 A | 12/2002 |
| JP | 2005-012167 A | 1/2005 |
| JP | 2007-258259 A | 10/2007 |
| JP | 2007-281134 A | 10/2007 |
| JP | 2008-124514 A | 5/2008 |
| JP | 2010-123865 A | 6/2010 |
| JP | 2011-165725 A | 8/2011 |
| JP | 2013-026392 A | 2/2013 |
| JP | 2013-058558 A | 3/2013 |
| JP | 2013-153009 A | 8/2013 |
| JP | 2014-017314 A | 1/2014 |
| JP | 2014-086718 A | 5/2014 |
| JP | 2014-138168 A | 7/2014 |
| JP | 2014-187058 A | 10/2014 |
| JP | 2015-065284 A | 4/2015 |
| JP | 2015-204451 A | 11/2015 |
| TW | 201310474 A | 3/2013 |
| TW | M464796 U | 11/2013 |
| WO | 2007/080680 A1 | 7/2007 |

OTHER PUBLICATIONS

An Office Action mailed by the Taiwan Patent Office dated Aug. 20, 2018, which corresponds to Taiwanese Patent Application No. 104141078 and is related to U.S. Appl. No. 15/613,498.

Notification of the First Office Action issued by the State Intellectual Property Office of the People's Republic of China dated Feb. 5, 2018, which corresponds to Chinese Patent Application No. 201580066177.4 and is related to U.S. Appl. No. 15/613,498.

An Office Action; "Notification of Reasons for Rejection," Mailed by the Japanese Patent Office dated Jun. 26, 2018, which corresponds to Japanese Patent Application No. 2017-109320 and is related to U.S. Appl. No. 15/613,498; with English language translation.

International Search Report issued in PCT/JP2015/084060; dated Feb. 16, 2016.

Written Opinion issued in PCT/JP2015/084060; dated Feb. 16, 2016.

International Preliminary Report on Patentability issued in PCT/JP2015/084060; dated Jun. 13, 2017.

An Office Action; "Notice of Reasons for Rejection," issued by the Japanese Patent Office dated Feb. 21, 2017, which corresponds to Japanese Patent Application No. 2014-249622 and is related to U.S. Appl. No. 15/613,498.

* cited by examiner

ELECTRONIC COMPONENT AND METHOD OF MANUFACTURING SAME

CROSS REFERENCE TO RELATED APPLICATIONS

This application claims benefit of priority to Japanese Patent Application 2014-249622 filed Dec. 10, 2014, and to International patent application Ser. No. PCT/JP2015/084060 filed Dec. 3, 2015, the entire content of which is incorporated herein by reference.

TECHNICAL FIELD

The present disclosure relates to an electronic component including an element body having a circuit element therein and a terminal formed on the element body.

BACKGROUND

In some conventional electronic components, an element body having a circuit element therein is formed by laminating an insulator layer and a conductor pattern or by disposing a wound conductive wire inside, and a terminal is formed over an end surface and four surfaces adjacent to the end surface of the element body.

In an electronic device on which this kind of electronic component is mounted, distance from a mounting substrate to an upper substrate thereof, a shielding case, or the like, and a distance to another adjacently mounted electronic component are reduced in association with miniaturization. Mounting a conventional electronic component on a mounting substrate of such an electronic device has a problem such that a terminal formed on an upper surface of the electronic component comes into contact with the upper substrate or the shielding case, and causes a short circuit with the upper substrate or the shielding case, or such that terminals of adjacent electronic components come into contact with each other and cause a short circuit between the electronic parts.

To solve such a problem, some electronic components have terminals 132 formed only on a bottom surface of an element body 131 as shown in FIG. 13 (see, e.g., Japanese Laid-Open Patent Publication No. 2014-138168) or have terminals 142 formed over a bottom surface and side surfaces of an element body 141 as shown in FIG. 14 (see, e.g., Japanese Laid-Open Patent Publication No. 2013-153009).

Since the conventional electronic component shown in FIG. 13 has an end portion of a conductor pattern led out to the bottom surface of the element body 131 through a conductor V in a through-hole provided in an insulator layer and the conductor V is connected to the terminals 132 on the bottom surface of the element body 131, a structure inside the element body is complicated and the characteristics cannot be improved because of a space for forming the conductor V.

Since the conventional electronic component shown in FIG. 14 must have a winding axis of a coil made parallel to the mounting surface of the element body, it is difficult to reduce the height.

To solve such problems, as shown in FIG. 15, a conductive material is applied over end surfaces and four surfaces adjacent to the end surfaces of an element body 151, baked, and plated with tin or a tin alloy to form terminals 152, and this element body 151 is covered with a resin film 153 except a bottom surface in some electronic components (see, e.g., Japanese Laid-Open Patent Publication Nos. 2013-26392 and 2013-58558).

Since an end portion of the resin film covering the element body formed in this way tends to be thin and the terminals are covered with a tin or tin alloy plating, solder enters inside through a gap between a terminal and an insulating film as well as through the tin or tin alloy plating at the time of connection to a wiring pattern of a mounting substrate, and thereby causing a problem of a destruction of the insulating film and a deterioration in insulation.

SUMMARY

It is an object of one or more embodiments of the present disclosure to provide an electronic component capable of preventing a short circuit with an upper substrate or a shielding case and a short circuit between electronic components, and capable of preventing a destruction of an insulating film and a deterioration in insulation.

One or more embodiments of the present disclosure provides an electronic component comprising an element body having a circuit element therein; and a terminal formed on the element body, wherein the terminal is formed over an end surface and a surface adjacent to the end surface of the element body, wherein an insulating film covering the terminal is formed on the element body, wherein the terminal is exposed from the insulating film at least on a mounting surface of the element body, and wherein a plating film containing tin is formed only on a portion of the terminal exposed from the insulating film.

One or more embodiments of the present disclosure also provides an electronic component comprising an element body having a circuit element therein; and a terminal formed on the element body, wherein the terminal is formed over an end surface and a surface adjacent to the end surface of the element body, wherein an insulating film covering the terminal is formed on the element body, wherein the insulating film has a removed part formed at least on a mounting surface of the element body, and wherein a plating film is formed in the removed part.

One or more embodiments of the present disclosure further provides an electronic component comprising an element body having a circuit element therein; and a terminal formed on the element body, wherein the terminal is formed over an end surface and a surface adjacent to the end surface of the element body and has a surface on which a first plating film is formed with a second plating film formed on a portion of the first plating film, and wherein an insulating film is formed on a location on the element body other than a portion on which the second plating film of the terminal is formed.

One or more embodiments of the present disclosure further provides a method of manufacturing an electronic component including an element body having a circuit element therein and a terminal formed on the element body, the method comprising the steps of forming an element body having a circuit element therein and forming a terminal on the element body; forming an insulating film on the element body to cover the terminal; removing the insulating film to form a removed part in which the terminal is exposed on a bottom surface; and applying plating to form a plating film on the removed part.

One or more embodiments of the present disclosure further provides a method of manufacturing an electronic component including an element body having a circuit element therein and a terminal formed on the element body, the method comprising the steps of forming an element body having a circuit element therein, forming a terminal on the element body, and forming a first plating film on the terminal; forming an insulating film on the element body; and forming a second plating film on the first plating film of the terminal exposed from the insulating film.

Since one or more embodiments of the present disclosure provides an electronic component comprising an element body having a circuit element therein; and a terminal formed on the element body, wherein the terminal is formed over an end surface and a surface adjacent to the end surface of the element body, wherein an insulating film covering the terminal is formed on the element body, wherein the terminal is exposed from the insulating film at least on a mounting surface of the element body, and wherein a plating film containing tin is formed only on a portion of the terminal exposed from the insulating film, a short circuit with an upper substrate or a shielding case and a short circuit between electronic components may be prevented, and the destruction of the insulating film and the deterioration in insulation may be prevented.

Since one or more embodiments of the present disclosure also provides an electronic component comprising an element body having a circuit element therein; and a terminal formed on the element body, wherein the terminal is formed over an end surface and a surface adjacent to the end surface of the element body, wherein an insulating film covering the terminal is formed on the element body, wherein the insulating film has a removed part formed at least on a mounting surface of the element body, and wherein a plating film is formed in the removed part, a short circuit with an upper substrate or a shielding case and a short circuit between electronic components may be prevented, and the destruction of the insulating film and the deterioration in insulation may be prevented.

Since one or more embodiments of the present disclosure further provides an electronic component comprising an element body having a circuit element therein; and a terminal formed on the element body, wherein the terminal is formed over an end surface and a surface adjacent to the end surface of the element body and has a surface on which a first plating film is formed with a second plating film formed on a portion of the first plating film, and wherein an insulating film is formed on a location on the element body other than a portion on which the second plating film of the terminal is formed, a short circuit with an object around the electronic component may be prevented, and the destruction of the insulating film and the deterioration in insulation may be prevented.

Since one or more embodiments of the present disclosure further provides a method of manufacturing an electronic component including an element body having a circuit element therein and a terminal formed on the element body, the method comprising the steps of forming an element body having a circuit element therein and forming a terminal on the element body; forming an insulating film on the element body to cover the terminal; removing the insulating film to form a removed part in which the terminal is exposed on a bottom surface; and applying plating to form a plating film on the removed part, a short circuit with an upper substrate or a shielding case and a short circuit between electronic components may be prevented, and the destruction of the insulating film and the deterioration in insulation may be prevented.

Since one or more embodiments of the present disclosure further provides a method of manufacturing an electronic component including an element body having a circuit element therein and a terminal formed on the element body, the method comprising the steps of forming an element body having a circuit element therein, forming a terminal on the element body, and forming a first plating film on the terminal; forming an insulating film on the element body; and forming a second plating film on the first plating film of the terminal exposed from the insulating film, a short circuit with an object around the electronic component may be prevented, and the destruction of the insulating film and the deterioration in insulation may be prevented.

DETAILED DESCRIPTION

One or more embodiments of the present disclosure includes an element body having a circuit element therein and a terminal formed on the element body. The terminal is formed over an end surface and four surfaces adjacent to the end surface of the element body. On the element body on which the terminal is formed, an insulating film is formed to cover the terminal. The terminal is exposed from the insulating film at least on a mounting surface of the element body. This insulating film has a removed part formed on at least the mounting surface of the element body in which the terminal is exposed on the bottom surface. A plating film is formed on the terminal exposed from this insulating film. An external terminal is formed of the terminal covered with this insulating film and the plating film.

Figure 13:
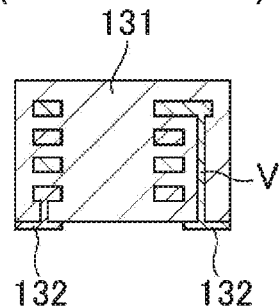
FIG. 13 is a cross-sectional view of a conventional electronic component.
Figure 14:
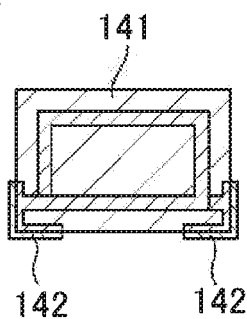
FIG. 14 is a cross-sectional view of another conventional electronic component.
Figure 15:
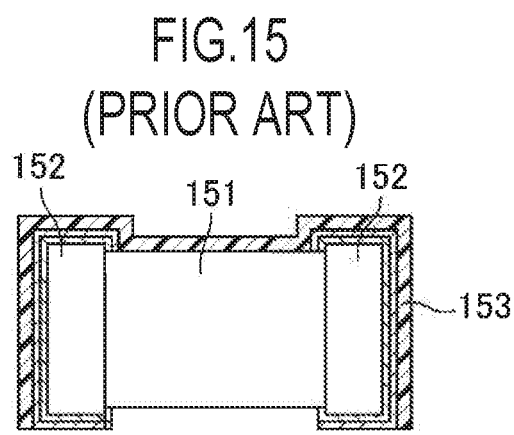
FIG. 15 is a cross-sectional view of yet another conventional electronic component.

Therefore, in one or more embodiments of the present disclosure, since the terminal formed on the element body is covered with the insulating film, the terminal may electrically be insulated from the surrounding by the insulating film and may be connected to a wiring pattern of a mounting substrate by the plating film formed in the removed part of the insulating film. Additionally, in one or more embodiments of the present disclosure, since it is not necessary to make the shape of the circuit element built in the element body into a special structure, a conventional electronic component before improvement as shown in FIGS. 13 and 14 may be utilized without a change, and the characteristics of the circuit element may be improved by effectively utilizing a space inside the element body. Furthermore, in one or more embodiments of the present disclosure, since the terminal is exposed on the bottom surface of the removed part of the insulating film on the mounting surface of the element body and the plating film is formed on the removed part, the thickness of the end portion of the insulating film may be increased as compared to a conventional thickness, and the plating film for blocking entry of solder may be included, so that the entry of solder between the terminal and the insulating film can be prevented at the time of connection to the wiring pattern of the mounting substrate. Moreover, by applying a base plating and a tin or tin alloy plating onto the terminal exposed on the removed part, the solder leaching of the terminal may be prevented and the solder wettability may be made better. Furthermore, in the case of using an element body of ferrite or the like tending to cause elongation of plating, since the terminal is covered with the insulating film except a portion on which a plating film is formed, the terminal may be prevented from varying in width due to occurrence of the elongation of plating in a contact portion between the element body and the terminal when the plating is applied. In the case of using an element body with low density to form the electronic component with the element body entirely covered with a resin, it is not necessary to impregnate the element body with the resin. Moreover, the electronic component of the present disclosure may have a shape of an external terminal formed into various shapes depending on a shape of the removed part.

Preferred embodiments for carrying out the present disclosure will hereinafter be described with reference to FIGS. 1 to 12.

Figure 1:
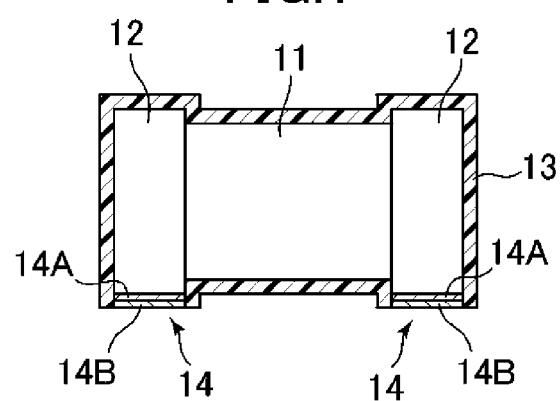
FIG. 1 is a partial cross-sectional view of a first embodiment of an electronic component of the present disclosure.

FIG. 1 is a partial cross-sectional view of a first embodiment of the electronic component of the present disclosure, and 11 and 12 denote an element body and a terminal, respectively.

An element body 11 is made of a magnetic material such as ferrite, a metallic magnetic material, and an insulator such as a dielectric material and has a circuit element formed therein. The circuit element is formed inside the element body by laminating insulator layers and conductor patterns and helically connecting the conductor patterns between the insulator layers to form a coil, by laminating insulator layers and conductor patterns and acquiring a capacitance between the conductor patterns to form a capacitor, by integrally forming the coil and the capacitor to form an LC circuit, or by disposing a coil of wound conductive wires inside.

The terminals 12 are each formed over an end surface and four surfaces adjacent to the end surface of the element body 11. The terminals 12 are formed by forming electrodes by using a technique such as dip coating of a material containing a conductor such as silver, palladium, and copper.

The element body 11 with the terminals 12 formed thereon is entirely covered with an insulating film 13. The insulating film 13 is made of a resin such as an epoxy resin, a silicone resin, and an acrylic resin, or an insulator having an insulating property such as glass. Removed parts in which the terminals 12 are exposed on bottom surfaces are formed in portions corresponding to the terminals 12 on a mounting surface of the element body 11, and plating films 14 connected to the terminals 12 are formed in these removed parts. The plating films 14 are formed by forming base plating films 14A made of a conductive material such as copper and nickel on surfaces of the terminals 12 and forming plating films 14B made of tin or a tin alloy on surfaces of the base plating films 14A. External terminals are formed of the terminals 12 covered with the insulating film 13 and the plating films 14.

Figure 2A:
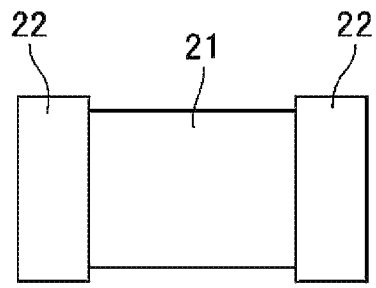
FIGS. 2(A), 2(B), 2(C) and 2(D) are partial cross-sectional views for explaining a manufacturing method of the first embodiment of the electronic component of the present disclosure.

For the electronic component formed in this way, first, an element body is formed with a circuit element formed therein by laminating insulator layers and conductor patterns and helically connecting the conductor patterns between the insulator layers to form a coil, by laminating insulator layers and conductor patterns and acquiring a capacitance between the conductor patterns to form a capacitor, by integrally forming the coil and the capacitor to form an LC circuit, or by disposing a coil of wound conductive wires on the inside. As shown in FIG. 2(A), this element body has terminals 22 each formed over an end surface and four surfaces adjacent to the end surface of an element body 21. The terminals are formed by sintering a conductive paste containing a conductive material such as silver, palladium, and copper applied through coating or the like to the element body 21, or by curing or sintering a conductive paste containing a conductive material such as silver, palladium, and copper and a resin applied through coating or the like to the element body 21.

Figure 2B:
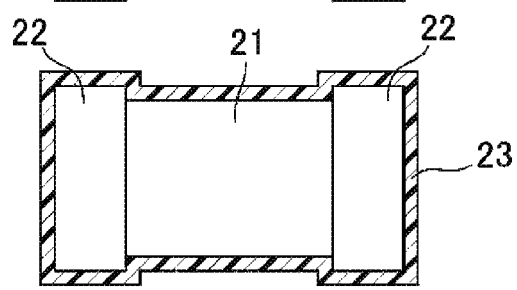

Subsequently, the element body 21 having the terminals 22 formed thereon is entirely coated by applying a resin such as an epoxy resin, a silicone resin, and an acrylic resin or an insulator having an insulating property such as glass so that, as shown in FIG. 2(B), the element body 21 having the terminals 22 formed thereon is entirely covered with an insulating film 23. The insulating film 23 preferably has a thickness of 2 to 30 μm. A method of the coating may be various methods such as application by dipping or spraying, electrodeposition coating, drum type rotary coating or the like.

Figure 2C:
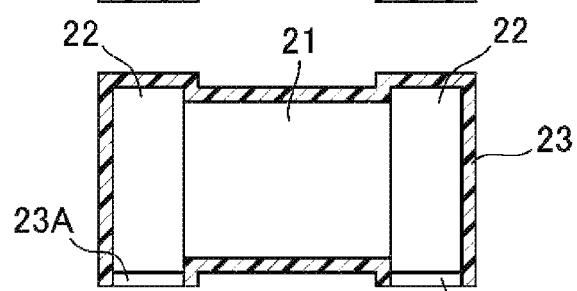

Subsequently, portions of the insulating film 23 corresponding to the terminals 22 on a mounting surface of the element body 21 are exfoliated and removed by heating with a laser device or a heat source device or by a mechanical method such as sandblasting and polishing so as to form removed parts 23A with surfaces of the terminals 22 exposed on bottom surfaces thereof as shown in FIG. 2(C).

Figure 2D:
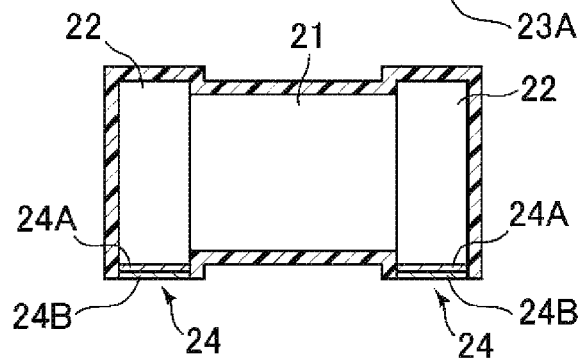

Base plating films 24A made of a conductive material such as copper and nickel are further formed on the surfaces of the terminals 22 exposed on the bottom surfaces of the removed parts 23A, and plating films 24B made of tin or a tin alloy are formed on surfaces of the base plating films 24A, and thereby forming plating films 24 connected to the terminals 22 in the removed parts as shown in FIG. 2(D).

FIG. 3 is a partial cross-sectional view for explaining a second embodiment of the electronic component of the present disclosure and a manufacturing method thereof.

Figure 3A:
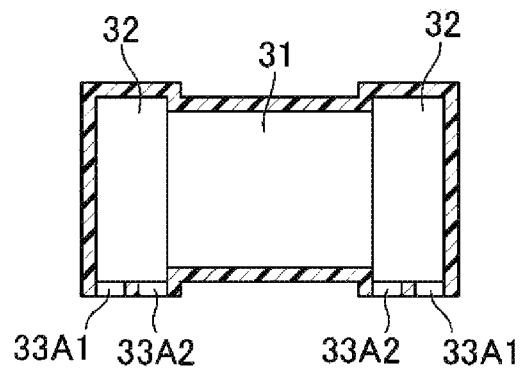
FIGS. 3(A) and 3(B) are partial cross-sectional views for explaining a second embodiment of the electronic component of the present disclosure and a manufacturing method thereof.

In the present embodiment, the structures of the removed parts and the external terminals are different from those of the first embodiment. First, with regard to the removed parts, as shown in FIG. 3(A), at a position corresponding to each of terminals 32, a plurality of removed parts extending in the width direction of an element body 31 are arranged and formed in the length direction of the element body 31.

Figure 3B:
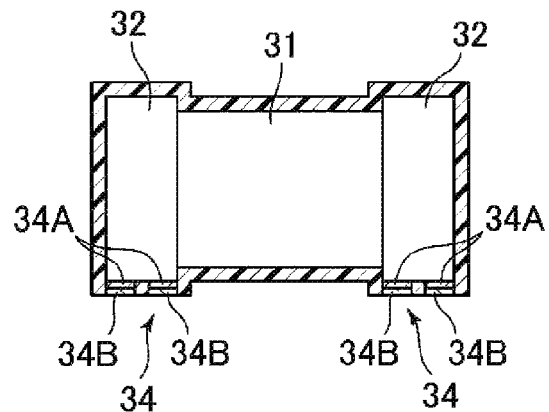

Subsequently, as shown in FIG. 3(B), base plating films 34A made of a conductive material such as copper and nickel are formed on surfaces of the terminals 32 exposed on bottom surfaces of a plurality of removed parts 33A1, 33A2, and plating films 34B made of tin or a tin alloy are formed on surfaces of the base plating films 34A, and thereby forming plating films 34 connected to the terminals 32 on the removed parts.

When the electronic component is formed in this way, a plurality of plating films extending in the width direction of the element body are formed on each of the terminals and, therefore, at the time of connection to a wiring pattern of a mounting substrate by solder, a solder fillet may be allowed to enter between the plating films so that the mounting on the mounting substrate may be made stable.

Figure 4:
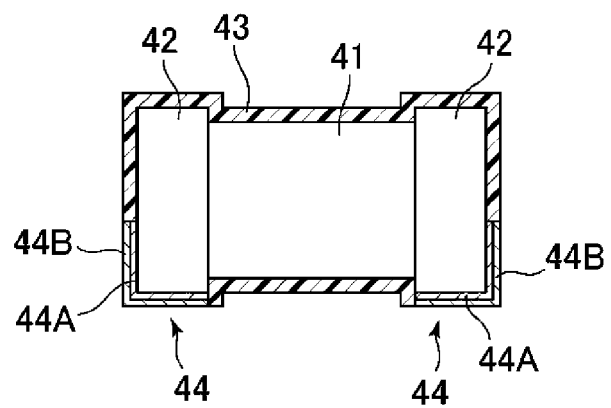
FIG. 4 is a partial cross-sectional view of a third embodiment of the electronic component of the present disclosure.

FIG. 4 is a partial cross-sectional view of a third embodiment of the electronic component of the present disclosure.

An element body 41 is made of a magnetic material such as ferrite, a metallic magnetic material, and an insulator such as a dielectric material and has a circuit element formed therein.

Terminals 42 are each formed over an end surface and four surfaces adjacent to the end surface of the element body 41. The terminals 42 are formed by forming electrodes by using a material containing a conductor such as silver, palladium, and copper.

The element body 41 with the terminals 42 formed thereon is entirely covered with an insulating film 43. The insulating film 43 is made of a resin such as an epoxy resin, a silicone resin, and an acrylic resin, or an insulator having an insulating property such as glass, and removed parts formed in which the terminals 42 are exposed on bottom surfaces are formed in portions corresponding to the terminals 42 on a mounting surface and respective surfaces adjacent to the mounting surface of the element body 41, and plating films 44 connected to the terminals 42 are formed in these removed parts. The plating films 44 are formed by forming base plating films 44A made of a conductive material such as copper and nickel on surfaces of the terminals 42 and forming plating films 44B made of tin or a tin alloy on surfaces of the base plating films 44A. External terminals are formed of the terminals 42 covered with the insulating film 43 and the plating films 44. The external terminals are each formed into an L shape over the mounting surface and a surface adjacent to the mounting surface of the electronic component. The shape of the external terminals may be changed in accordance with the shape of the removed parts and may be extended to the surface opposite to the mounting surface, and thereby forming the U-shaped external terminals.

Figure 5:
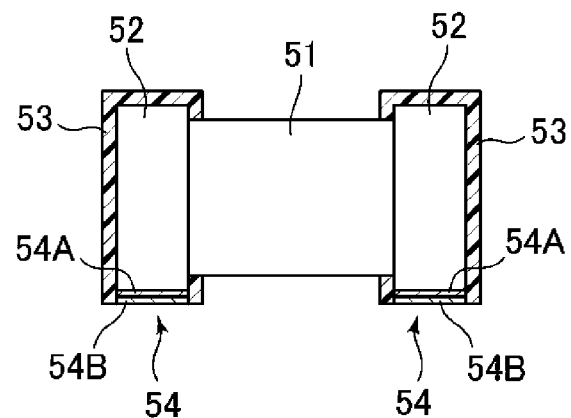
FIG. 5 is a partial cross-sectional view of a fourth embodiment of the electronic component of the present disclosure.

FIG. 5 is a partial cross-sectional view of a fourth embodiment of the electronic component of the present disclosure.

An element body 51 is made of a magnetic material such as ferrite, a metallic magnetic material, and an insulator such as a dielectric material.

Terminals 52 are each formed over an end surface and four surfaces adjacent to the end surface of the element body 51. The terminals 52 are formed by forming electrodes by using a material containing a conductor such as silver, palladium, and copper.

The element body 51 with the terminals 52 formed thereon has respective insulating films 53 formed on both end portions of the element body 52 with the terminals 52 formed thereon such that the terminals 52 are covered. Each of the insulating films 53 is made of a resin such as an epoxy resin, a silicone resin, and an acrylic resin, or an insulator having an insulating property such as glass, and a removed part in which the terminal is exposed on a bottom surface is formed in a portion corresponding to the terminal 52 on a mounting surface of the element body 51, and a plating film 54 connected to the terminal 52 is formed in this removed part. The removed part is formed to be smaller than the area of the insulating film 53 on the mounting surface. The plating film 54 is formed by forming a base plating film 54A made of a conductive material such as copper and nickel on a surface of the terminals 52 and forming a plating film 54B made of tin or a tin alloy on a surface of the base plating film 54A. External terminals are formed of the terminals 52 covered with the insulating films 53 and the plating films 54.

Even if the electronic component is formed in this way, solder may be prevented from entering between a terminal and an insulating film and the insulating material of the insulating films may be saved.

Figure 6:
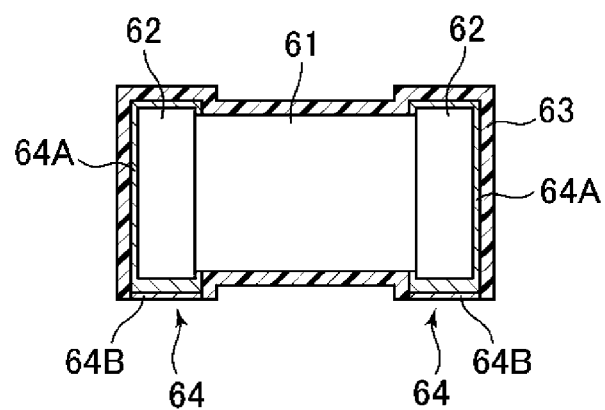
FIG. 6 is a partial cross-sectional view of a fifth embodiment of the electronic component of the present disclosure.

FIG. 6 is a partial cross-sectional view of a fifth embodiment of the electronic component of the present disclosure.

An element body 61 is made of a magnetic material such as ferrite, a metallic magnetic material, and an insulator such as a dielectric material and has a circuit element formed therein.

Terminals 62 are each formed over an end surface and four surfaces adjacent to the end surface of the element body 61. The terminals 62 are formed by forming electrodes by using a material containing a conductor such as silver, palladium, and copper. Base plating films 64A are formed on surfaces of the terminals 62. The base plating films 64A are made of a conductive material such as copper and nickel and each have a thickness made larger in a portion corresponding to a mounting surface of the element body 61 than the thickness of the other portion.

This element body 61 is entirely covered with an insulating film 63 such that the surfaces of the thicker portions of the base plating films 64A are exposed in removed parts. The insulating film 63 is made of a resin such as an epoxy resin, a silicone resin, and an acrylic resin, or an insulator having an insulating property such as glass. Plating films 64B made of tin or a tin alloy are formed on the surfaces of the thicker portions of the base plating films 64A exposed in the removed parts. Plating films 64 are formed of the base plating films 64A and the plating films 64B made of tin or a tin alloy, and external terminals are formed of the plating films 64 and the terminals 62.

Figure 7A:
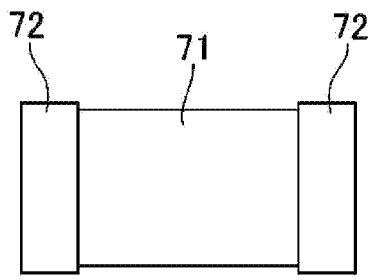
FIGS. 7(A), 7(B), 7(C), 7(D) and 7(E) are partial cross-sectional views for explaining a manufacturing method of the fifth embodiment of the electronic component of the present disclosure.

For the electronic component formed in this way, first, an element body is formed with a circuit element formed therein. As shown in FIG. 7(A), this element body has terminals 72 each formed over an end surface and four surfaces adjacent to the end surface of an element body 71. The terminals 72 are formed by curing or sintering a conductive paste containing a conductive material such as silver, palladium, and copper and a resin applied through coating or the like to the element body 71.

Figure 7B:
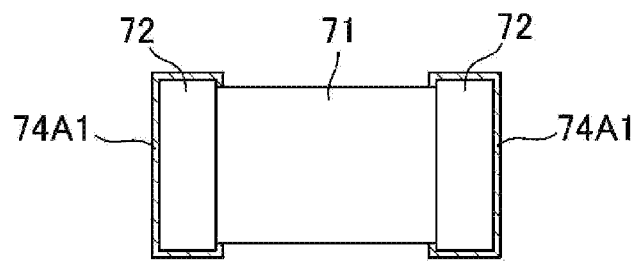

As shown in FIG. 7(B), base plating films 74A1 made of a conductive material such as copper and nickel are formed on surfaces of the terminals 72.

Figure 7C:
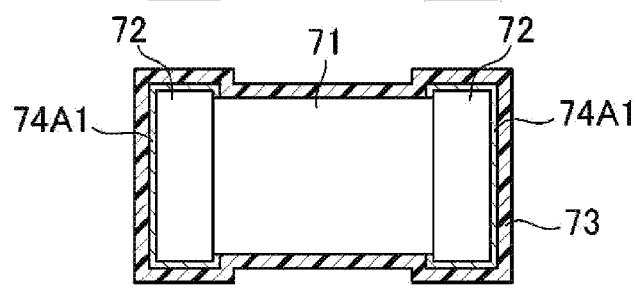

Subsequently, the element body 71 is entirely coated by applying a resin such as an epoxy resin, a silicone resin, and an acrylic resin or an insulator having an insulating property such as glass so that, as shown in FIG. 7(C), the element body 71 is entirely covered with an insulating film 73. The insulating film 73 preferably has a thickness of 2 to 30 µm. A method of the coating may be various methods such as application by dipping or spraying, electrodeposition coating, and drum type rotary coating.

Figure 7D:
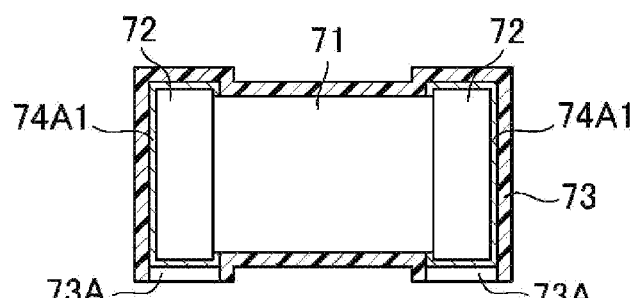

Portions of the insulating film 73 corresponding to the terminals 72 on a mounting surface of the element body 71 are exfoliated and removed by heating with a laser device or a heat source device or by a mechanical method such as sandblasting and polishing, and thereby forming removed parts 73A with surfaces of the base plating films 74A1 exposed on bottom surfaces thereof as shown in FIG. 7(D).

Figure 7E:
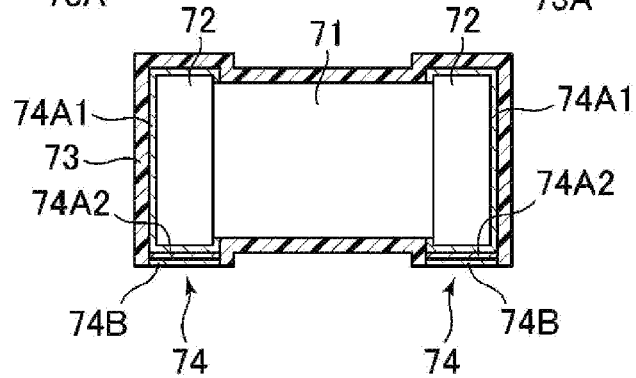

Subsequently, base plating films 74A2 made of a conductive material such as copper and nickel are formed on the surfaces of the base plating films 74A1 exposed on the bottom surfaces of the removed parts 73A, and plating films 74B made of tin or a tin alloy are formed on surfaces of the base plating films 74A2 and thereby forming plating films 74 connected to the terminals 72 in the removed parts as shown in FIG. 7(E). In this case, the base plating films 74A1 and the base plating films 74A2 may be made of the same material or may be made of different materials. Alternatively, the plating films 74B made of tin or a tin alloy may be formed on the surfaces of the base plating films 74A1 to form the plating films 74 connected to the terminals 72 in the removed parts.

In the case of the electronic component formed in this way, even if the base plating films 74A2 formed in the removed parts 73A and the plating films 74B made of tin or a tin alloy are insufficiently formed so that a gap from a resin film is generated, the solder leaching of the terminals may be prevented since the terminals are covered with the base plating films 74A1.

Figure 8:
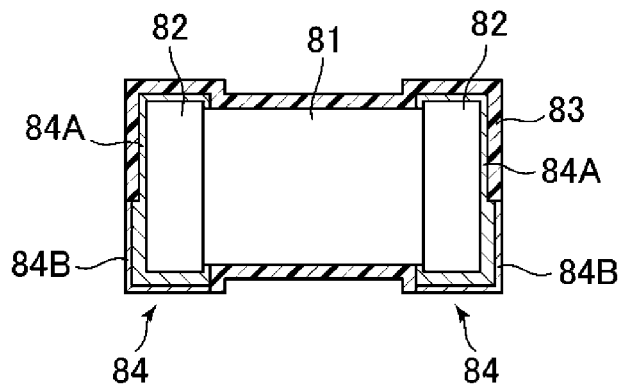
FIG. 8 is a partial cross-sectional view of a sixth embodiment of the electronic component of the present disclosure.

FIG. 8 is a partial cross-sectional view of a sixth embodiment of the electronic component of the present disclosure.

An element body 81 is made of a magnetic material such as ferrite, a metallic magnetic material, and an insulator such as a dielectric material and has a circuit element formed therein.

Terminals 82 are each formed over an end surface and four surfaces adjacent to the end surface of the element body 81. The terminals 82 are formed by forming electrodes by using a material containing a conductor such as silver, palladium, and copper. Base plating films 84A are formed on surfaces of the terminals 82. The base plating films 84A are made of a conductive material such as copper and nickel and each have a thickness made larger in a portion corresponding to a mounting surface and a surface adjacent to the mounting surface of the element body 81 than the thickness of the other portion.

This element body 81 is entirely covered with an insulating film 83 such that the surfaces of the thicker portions of the base plating films 84A are exposed in removed parts. The insulating film 83 is made of a resin such as an epoxy resin, a silicone resin, and an acrylic resin, or an insulator having an insulating property such as glass. The removed parts are formed in the portions corresponding to the terminals 82 on the mounting surface and the respective surfaces adjacent to the mounting surface of the element body 81. Plating films 84B made of tin or a tin alloy are formed on the surfaces of the thicker portions of the base plating films 84A exposed in the removed parts. Plating films 84 are formed of the base plating films 84A and the plating films 84B made of tin or a tin alloy, and external terminals are formed of the plating films 84 and the terminals 82. The external terminals are each formed into an L shape over the mounting surface and a surface adjacent to the mounting surface of the electronic component. The shape of the external terminals may be changed in accordance with the shape of the removed parts and may be extended to the surface opposite to the mounting surface and thereby forming the U-shaped external terminals.

Figure 9:
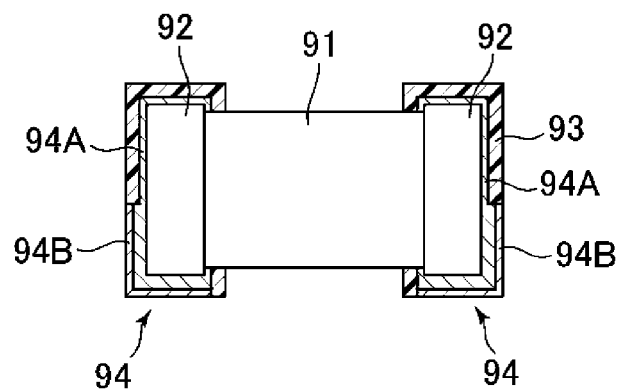
FIG. 9 is a partial cross-sectional view of a seventh embodiment of the electronic component of the present disclosure.

FIG. 9 is a partial cross-sectional view of a seventh embodiment of the electronic component of the present disclosure.

An element body 91 is made of a magnetic material such as ferrite, a metallic magnetic material, and an insulator such as a dielectric material.

Terminals 92 are each formed over an end surface and four surfaces adjacent to the end surface of the element body 91. The terminals 92 are formed by forming electrodes by using a material containing a conductor such as silver, palladium, and copper. Base plating films 94A are formed on surfaces of the terminals 92. The base plating films 94A are made of a conductive material such as copper and nickel and each have a thickness made larger in a portion corresponding to a mounting surface and a surface adjacent to the mounting surface of the element body 91 than the thickness of the other portion.

This element body 91 has insulating films 93 formed on portions of the terminals 92 on both end portions of the element body 91 such that the surfaces of the thicker portions of the base plating films 94A are exposed in removed parts. Each of the insulating films 93 is made of a resin such as an epoxy resin, a silicone resin, and an acrylic resin, or an insulator having an insulating property such as glass. The removed parts are formed such that the insulating film 93 partially remains on the mounting surface of the element body 91. Plating films 94B made of tin or a tin alloy are formed on the surfaces of the thicker portions of the base plating films 94A. Plating films 94 are formed of the base plating films 94A and the plating films 94B made of tin or a tin alloy, and external terminals are formed of the plating films 94 and the terminals 92.

Figure 10:
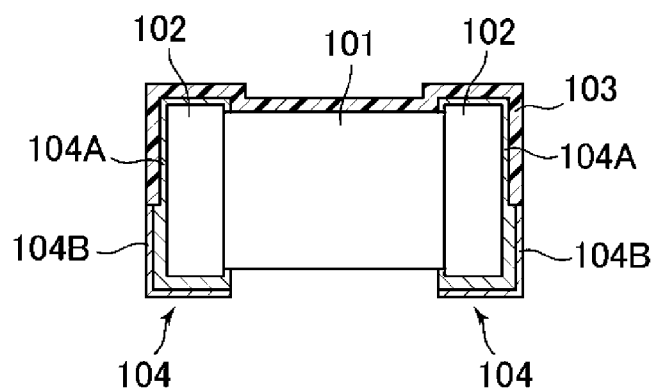
FIG. 10 is a partial cross-sectional view of an eighth embodiment of the electronic component of the present disclosure.

FIG. 10 is a partial cross-sectional view of an eighth embodiment of the electronic component of the present disclosure.

An element body 101 is made of a magnetic material such as ferrite, a metallic magnetic material, and an insulator such as a dielectric material.

Terminals 102 are each formed over an end surface and four surfaces adjacent to the end surface of the element body 101. The terminals 102 are formed by forming electrodes by using a material containing a conductor such as silver, palladium, and copper. Base plating films 104A are formed on surfaces of the terminals 102. The base plating films 104A are made of a conductive material such as copper and nickel and each have a thickness made larger in a lower portion of the element body 101 than the thickness of the other portion.

This element body 101 has an insulating film 103 formed on an upper portion of the element body 101 such that the surfaces of the thicker portions of the base plating films 104A are exposed in the lower portion of the element body 101, and plating films 104 are formed with plating films 104B made of tin or a tin alloy on the surfaces of the thicker portions of the base plating films 104A. The plating films 104 are formed of the base plating films 104A and the plating films 104B made of tin or a tin alloy, and external terminals are formed of the plating films 104 and the terminals 102.

Figure 11A:
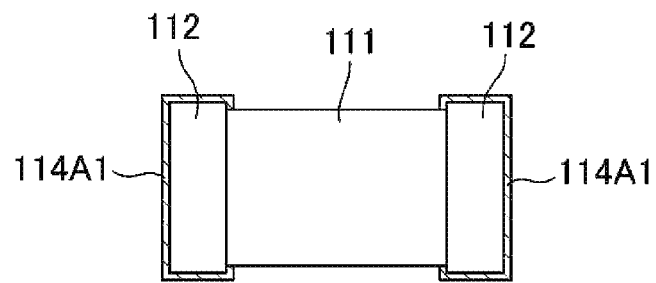
FIGS. 11(A), 11(B) and 11(C) are partial cross-sectional views for explaining a manufacturing method of the eighth embodiment of the electronic component of the present disclosure.

For the electronic component formed in this way, first, an element body is formed with a circuit element formed therein. As shown in FIG. 11(A), this element body has terminals 112 each formed over an end surface and four surfaces adjacent to the end surface of an element body 111.

The terminals 112 are formed by curing or sintering a conductive paste containing a conductive material such as silver, palladium, and copper and a resin applied through coating or the like to the element body 111. Base plating films 114A1 made of a conductive material such as copper and nickel are formed on surfaces of the terminals 112.

Figure 11B:
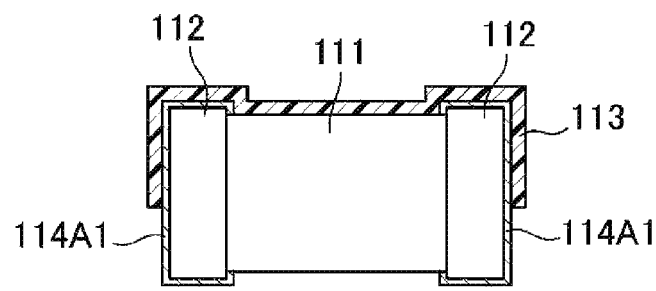

Next, an upper side of the element body 111 is then coated by applying a resin such as an epoxy resin, a silicone resin, and an acrylic resin or an insulator having an insulating property such as glass so that, as shown in FIG. 11(B), an upper portion of the element body 111 is covered with an insulating film 113. The insulating film 113 preferably has a thickness of 2 to 30 µm. A method of the coating may be various methods such as application by dipping or spraying, electrodeposition coating, and drum type rotary coating.

Figure 11C:
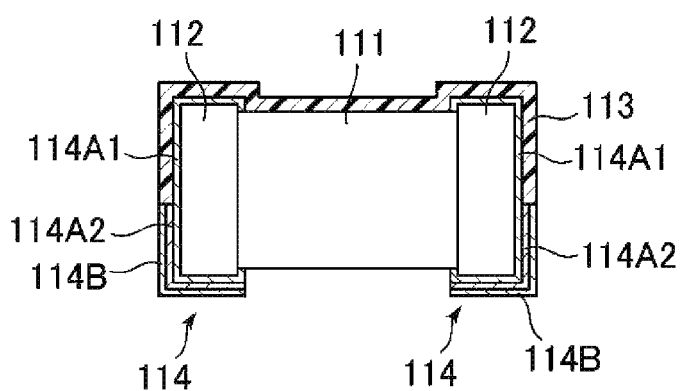

Subsequently, base plating films 114A2 made of a conductive material such as copper and nickel are formed on the surfaces of the base plating films 114A1 exposed on a lower portion of the element body 111, and plating films 114B made of tin or a tin alloy are formed on surfaces of the base plating films 114A2 and thereby forming plating films 114 connected to the terminals 112 as shown in FIG. 11(C). In this case, the base plating films 114A1 and the base plating films 114A2 may be made of the same material or may be made of different materials. If the base plating films 114A1 and the base plating films 114A2 are made of the same material, as shown in FIG. 10, thicker portions are formed in the base plating films, and the thicker portions of the base plating films are exposed from the insulating film 113. Alternatively, if the base plating films 114A1 and the base plating films 114A2 are made of different materials, the base plating films 114A1 may preferably be made of copper and the base plating films 114A2 may be made of nickel.

Plating films 114B made of tin or a tin alloy are further formed on the surfaces of the base plating films 114A1 and thereby forming plating films 114 connected to the terminals 112.

In the case of the electronic component formed in this way, the insulating film is formed on the element body after the base plating is formed on the entire terminals and, therefore, even if a gap exists between the insulating film 113 and each of the base plating films 114A2 and the plating films 114B made of a tin alloy, solder does not reach the terminals at the time of connection to the wiring pattern of the mounting board, and no solder leaching occurs in the terminals. Since the base plating films are formed again after forming the insulating film so that the plating films made of tin or a tin alloy are formed, the solder wettability may also be improved.

Figure 12A:
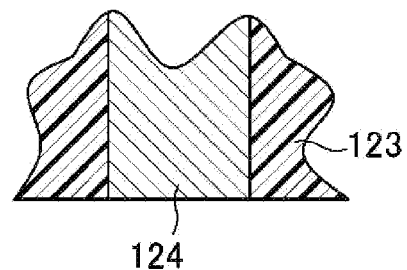
FIGS. 12(A), 12(B) and 12(C) are partially enlarged cross-sectional views for explaining another embodiment of the electronic component of the present disclosure.
Figure 12B:
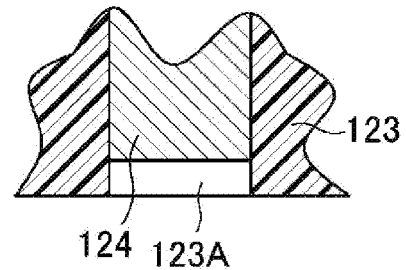
Figure 12C:
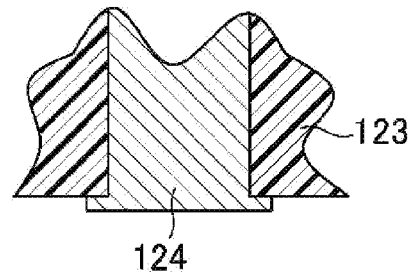

Although the embodiments of the electronic component and the method of manufacturing the same according to the present disclosure have been described, the present disclosure is not limited to the embodiments. For example, in the first to seventh embodiments, a plating film formed in a removed part of an insulating film may be formed such that a surface of a plating film 124 is at the same level as a surface of an insulating film 123 as shown in FIG. 12(A), such that the surface of the plating film 124 is formed in a removed part 123A as shown in FIG. 12(B), or such that the surface of the plating film 124 projects from the surface of the plating film 123 as shown in FIG. 12(C). If the surface of the plating film 124 projects from the surface of the insulating film 123, the area of the surface may be formed larger than that of the removed part, or a portion of the plating film projecting from the surface of the insulating film may be formed of a plating film made of tin or a tin alloy.

In the first to fourth embodiments, the base plating films 14A, 34A, 44A, 54A may be formed to extend between the terminals and the insulating film so as to cover the terminals.

In the eighth embodiment, the plating films 114B made of tin or a tin alloy may be formed on the surfaces of the base plating films 114A1.

For the terminals, metal plates may each be processed to cover an end surface and four surfaces adjacent to the end surface of an element body and may be attached to both ends of the element body, or electrodes or the like may each be formed over an end surface and at least one surface adjacent to the end surface of the element body to form various shapes such as an L shape and a U shape.

The invention claimed is:

1. An electronic component comprising:
an element body having a circuit element therein; and
a terminal formed on the element body,
wherein the terminal is formed over an end surface and a surface adjacent to the end surface of the element body and a first plating film not containing tin is formed on the terminal,
wherein an insulating film covering the terminal on which the first plating film is formed is formed on the element body,
wherein the first plating film of the terminal is exposed from the insulating film at least on a mounting surface of the element body, and
wherein a second plating film containing tin is formed on the first plating film exposed from the insulating film.

2. The electronic component according to claim 1, wherein the element body has a second circuit element formed therein by laminating an insulator layer and a conductor pattern.

3. The electronic component according to claim 1, wherein the element body has a coil formed therein by laminating insulator layers and conductor patterns and helically connecting the conductor patterns between the insulator layers.

4. The electronic component according to claim 1, wherein the element body includes a coil therein formed by winding a conductive wire.

5. An electronic component comprising:
an element body having a circuit element therein; and
a terminal formed on the element body,
wherein the terminal is formed over an end surface and a surface adjacent to the end surface of the element body and a first plating film not containing tin is formed on the terminal,
wherein an insulating film covering the terminal on which the first plating film is formed is formed on the element body,
wherein the insulating film has a removed part formed at least on a mounting surface of the element body, and the first plating film is exposed from the insulating film, and
wherein a second plating film containing tin is formed on the first plating film at the removed part.

6. The electronic component according to claim 5, wherein the element body is entirely covered with the insulating film.

7. The electronic component according to claim 5, wherein the removed part is formed over the mounting surface and a surface other than the mounting surface of the element body.

8. The electronic component according to claim 5, wherein the element body has a second circuit element formed therein by laminating an insulator layer and a conductor pattern.

9. The electronic component according to claim 5, wherein the element body has a coil formed therein by laminating insulator layers and conductor patterns and helically connecting the conductor patterns between the insulator layers.

10. The electronic component according to claim 5, wherein the element body includes a coil therein formed by winding a conductive wire.

11. A method of manufacturing an electronic component including an element body having a circuit element therein and a terminal formed on the element body, the method comprising the steps of:
   forming an element body having a circuit element therein and forming a terminal on the element body, and forming a first plating film not containing tin;
   forming an insulating film on the element body to cover the terminal on which the first plating film is formed;
   removing the insulating film to form a removed part in which the first plating film of the terminal is exposed on a bottom surface; and
   applying plating to form a second plating film containing tin on the first plating film at the removed part.

12. The method of manufacturing an electronic component according to claim 11, wherein when the insulating film is formed, the element body is entirely covered with the insulating film.

13. The method of manufacturing an electronic component according to claim 11, wherein the removed part is formed on a mounting surface of the element body.

14. The method of manufacturing an electronic component according to claim 11, wherein the removed part is formed over a mounting surface and a surface other than the mounting surface of the element body.

15. A method of manufacturing an electronic component including an element body having a circuit element therein and a terminal formed on the element body, the method comprising the steps of:
   forming an element body having a circuit element therein, forming a terminal on the element body, and forming a first plating film not containing tin on the terminal;
   forming an insulating film on the element body;
   removing the insulating film to expose the first plating film of the terminal; and
   forming a second plating film containing tin on the first plating film of the terminal exposed from the insulating film.

\* \* \* \* \*